US008576605B2

(12) United States Patent
Sasaki

(10) Patent No.: US 8,576,605 B2
(45) Date of Patent: Nov. 5, 2013

(54) NONVOLATILE SEMICONDUCTOR MEMORY DEVICE

(75) Inventor: Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 198 days.

(21) Appl. No.: 13/051,766

(22) Filed: Mar. 18, 2011

(65) Prior Publication Data

US 2011/0235399 A1      Sep. 29, 2011

(30) Foreign Application Priority Data

Mar. 24, 2010   (JP) .................................. 2010-67166

(51) Int. Cl.
*G11C 11/00*           (2006.01)
(52) U.S. Cl.
USPC ................. 365/148; 365/46; 365/55; 365/74; 365/97; 365/100; 365/131; 365/158; 365/171; 365/173; 365/163; 365/189.011; 365/189.15; 365/189.16; 365/189.07; 365/202; 365/207
(58) Field of Classification Search
USPC ......... 365/46, 55, 74, 97, 100, 131, 148, 158, 365/171, 173, 163, 189.011, 189.15, 365/189.16, 189.07, 202, 207
See application file for complete search history.

(56) References Cited

U.S. PATENT DOCUMENTS

| | | | |
|---|---|---|---|
| 2006/0203541 A1* | 9/2006 | Toda | .............................. 365/163 |
| 2008/0258129 A1* | 10/2008 | Toda | ................................ 257/5 |
| 2009/0268509 A1* | 10/2009 | Maejima | ........................ 365/148 |
| 2010/0054017 A1* | 3/2010 | Maejima | ........................ 365/148 |
| 2012/0281472 A1* | 11/2012 | Cernea | ...................... 365/185.03 |

FOREIGN PATENT DOCUMENTS

| | | | |
|---|---|---|---|
| JP | 2005-522045 | | 7/2005 |
| JP | 2006-514393 | | 4/2008 |
| JP | 2008-84533 | | 4/2008 |
| WO | WO 2009050969 | * | 4/2009 |

OTHER PUBLICATIONS

Office Action issued Jun. 19, 2012 in Japanese Application No. 2010-067166 (With English Translation).
U.S. Appl. No. 12/885,815, filed Sep. 20, 2010, Takahiko Sasaki.
U.S. Appl. No. 12/884,694, filed Sep. 17, 2010, Tomonori Kurosawa, et al.

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A nonvolatile semiconductor memory device according to an embodiment includes a memory cell array configured by plural memory cells each including a variable resistor and each provided between first and second lines. A control circuit applies to a memory cell through the first and second lines a writing voltage for writing data or a reading voltage for reading data. A sense amplifier circuit senses data retained in a memory cell based on a current flowing through the first line. In a data writing operation, the control circuit applies a writing voltage to each of n number of memory cells configuring one unit such that the memory cells may be supplied with different resistance values. In a data reading operation, the sense amplifier circuit compares level relationship of the resistance values of n number of memory cells configuring one unit and reads out n! patterns of data from the one unit.

15 Claims, 6 Drawing Sheets

3 cells can store 3!(=6) states.

NONVOLATILE SEMICONDUCTOR MEMORY DEVICE

CROSS REFERENCE TO RELATED APPLICATIONS

This application is based on and claims the benefit of priority from prior Japanese Patent Application No. 2010-67166, filed on Mar. 24, 2010, the entire contents of which are incorporated herein by reference.

FIELD

Embodiments described herein relate generally to a nonvolatile semiconductor memory device.

BACKGROUND

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistance varying memory is attracting attention as a candidate to succeed these kinds of semiconductor memory devices utilizing a MOSFET as a memory cell (refer, for example, to Patent Document 1). For example, there is known a resistance change memory (ReRAM: Resistive RAM) that has a transition metal oxide as a recording layer and is configured to store a resistance state in a nonvolatile manner.

Write of data to a memory cell is implemented by applying for a short time to a variable resistor a certain setting voltage Vset. As a result, the variable resistor changes from a high-resistance state to a low-resistance state. Hereinafter, this operation to change the variable resistor from a high-resistance state to a low-resistance state is called a setting operation.

In contrast, erase of data in the memory cell MC is implemented by applying for a long time to the variable resistor in the low-resistance state subsequent to the setting operation a resetting voltage Vreset which is lower than the setting voltage Vset of a time of the setting operation. As a result, the variable resistor changes from the low-resistance state to the high-resistance state. Hereinafter, this operation to change the variable resistor from a low-resistance state to a high-resistance state is called a resetting operation. The memory cell, for example, has the high-resistance state as a stable state (a reset state), and, in the case of binary data storage, data write is implemented by the setting operation which changes the reset state to the low-resistance state.

In order to determine whether a memory cell MC is in a high-resistance state or in a low-resistance state, this kind of conventional resistance change memory generates a reference current by a certain means and senses by a sense amplifier circuit a difference between the reference current and a cell current flowing through the memory cell. However, in the conventional resistance change memory, it is difficult to increase a margin between the distribution of resistance values of memory cells MC in a high-resistance state and the distribution of resistance values of memory cells MC in a low-resistance state for various reasons, which makes it difficult to set the reference current to an appropriate value. That is, the conventional scheme of determining data retained in a memory cell based on comparison between the reference current and a cell current cannot sufficiently reduce the possibility of erroneous data reading.

DETAILED DESCRIPTION

A nonvolatile semiconductor memory device according to an embodiment includes a memory cell array including a plurality of memory cells arranged therein. Each of the memory cells includes a variable resistor and is provided between a first line and a second line. A control circuit applies to a memory cell through the first and second lines a writing voltage for writing data or a reading voltage for reading data. A sense amplifier circuit senses data retained in a memory cell based on a current flowing through the first line. In a data writing operation, the control circuit applies a writing voltage to each of n number of memory cells configuring one unit such that the n number of memory cells may be supplied with different resistance values. In a data reading operation, the sense amplifier circuit compares the level relationship of the resistance values of the n number of memory cells configuring one unit, and reads out n! patterns of data from the one unit.

Next, an embodiment of the present invention will be explained in detail with reference to the drawings.

[Overall Configuration]

Figure 1:
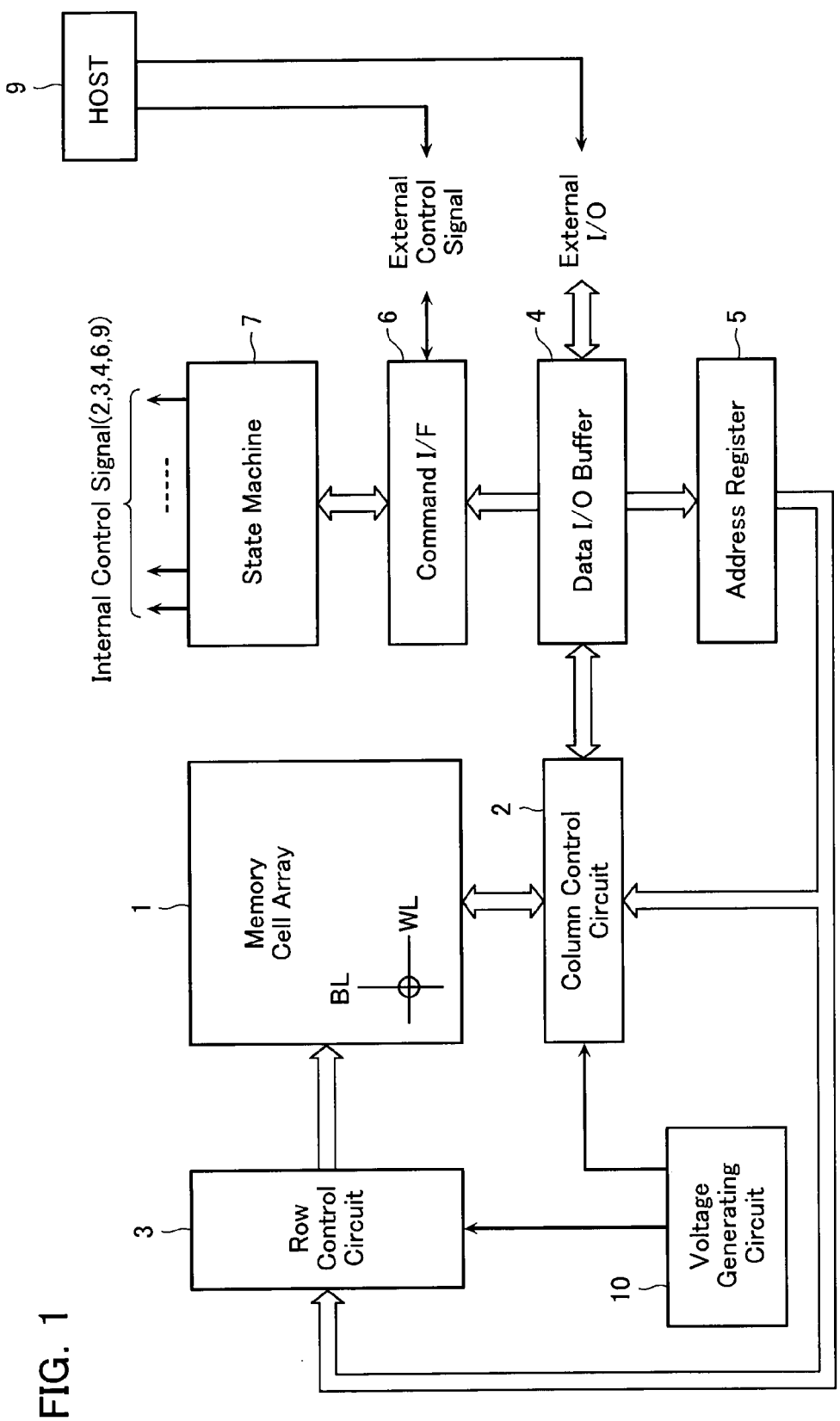
FIG. 1 is a block diagram of a nonvolatile semiconductor memory device according to an embodiment of the present invention.

FIG. 1 is a block diagram of a resistance change memory according to an embodiment of the present invention.

The resistance change memory includes a memory cell array 1 in which memory cells each using a variable resistor are arranged in a matrix.

Provided at a position adjoining the memory cell array 1 in a bit line BL direction is a column control circuit 2 configured to control the bit lines BL of the memory cell array 1 and execute erasing of data from a memory cell, writing of data to a memory cell, and reading of data from a memory cell. As will be described later, the column control circuit 2 includes selecting circuits 2a configured to select any of the bit lines BL, and sense amplifier circuits 2b configured to determine the level relationship of currents flowing through the bit lines BL.

Provided at a position adjoining the memory cell array 1 in a word line WL direction is a row control circuit 3 configured to select a word line WL of the memory cell array 1 and apply voltages necessary for erasing of data from a memory cell, writing of data to a memory cell, and reading of data from a memory cell. Together with the column control circuit 2, the row control circuit 3 functions as a control circuit configured to apply to a memory cell through the bit line BL and the word line WL a writing voltage for writing data or a reading voltage for reading data.

A data I/O buffer 4 is connected to an external host 9 via an I/O line, and receives write data and an erase instruction, outputs read data, and receives address data and command data. The data I/O buffer 4 sends received write data to the column control circuit 2, and receives read data from the column control circuit 2 to output it to the outside. An address supplied to the data I/O buffer 4 from the outside is sent to the column control circuit 2 and the row control circuit 3 via an address register 5.

A command supplied by the host 9 to the data I/O buffer 4 is sent to a command interface 6. The command interface 6 receives an external control signal from the host 9, determines whether data input in the data I/O buffer 4 is write data, a command, or an address, and when it is a command, transfers it as a received command signal to a state machine 7.

The state machine 7 manages the nonvolatile memory on the whole, receives a command from the host 9 via the command interface 6, and executes management of reading, writing, erasing, data I/O, etc.

The external host 9 can also receive status information managed by the state machine 7 and determine an operation result. The status information is also used for controlling writing and erasing.

A voltage generating circuit 10 is controlled by the state machine 7. Under this control, the voltage generating circuit 10 can output a pulse of an arbitrary voltage at an arbitrary timing.

The generated pulse can be transferred to an arbitrary line selected by the column control circuit 2 and the row control circuit 3. The peripheral circuit elements other than the memory cell array 1 can be formed on a Si substrate immediately under the memory cell array 1 formed in an interconnection layer, and hence the chip area of the nonvolatile memory can be substantially equal to the area of the memory cell array 1.

[Memory Cell Array and its Peripheral Circuits]

Figure 2:
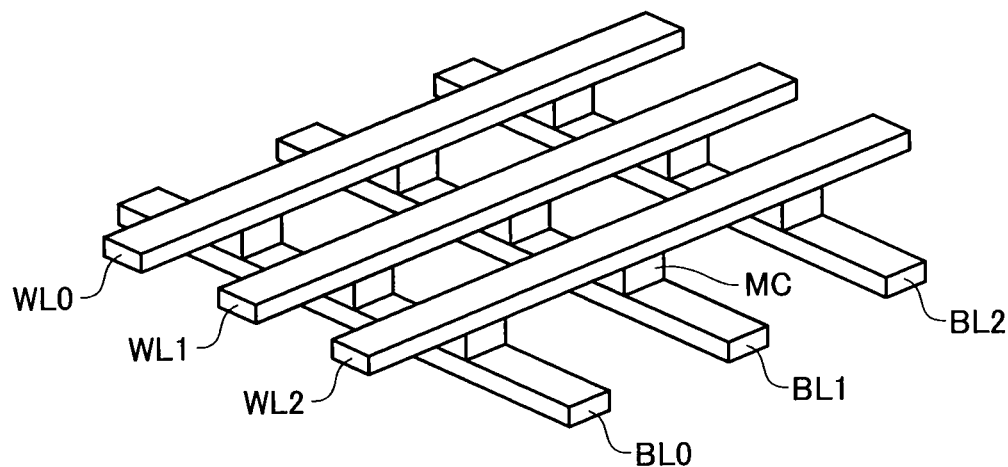
FIG. 2 is a perspective diagram of a part of a memory cell array 1.
Figure 3:
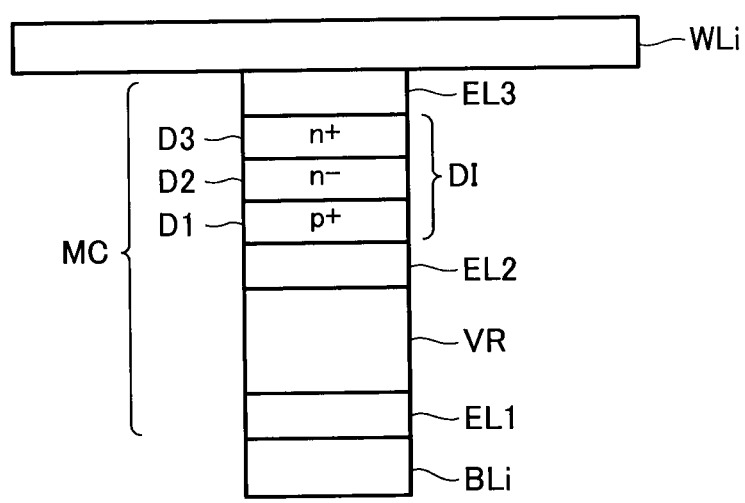
FIG. 3 is a cross-sectional diagram of FIG. 2 taken along a line I-I' and seen in the direction of arrow, showing one memory cell.

FIG. 2 is a perspective diagram of a part of the memory cell array 1. FIG. 3 is cross-sectional diagram of FIG. 2 taken along a line I-I' and seen in the direction of arrow, showing one memory cell. There are provided parallel word lines WL0 to WL2 as a plurality of first lines, parallel bit lines BL0 to BL2 as a plurality of second lines intersecting the word lines, and memory cells MC each provided at the intersection of the word line and bit line to be sandwiched therebetween. It is preferable that the first and second lines be made of a heat-resistant material having a low resistance value, such as W, WSi, NiSi, CoSi, etc.

[Memory Cell MC]

As shown in FIG. 3, a memory cell MC is configured by a series circuit of a variable resistor VR and a diode D1. The variable resistor VR can be made of, for example, carbon (C). Other than this, it may be made of a material having a resistance value which can change in response to voltage application. As shown in FIG. 3, the diode D1 is configured by a PIN diode including a p+ type layer D1, an n− type layer D2, and an n+ type layer D3, and formed sandwiched between electrodes EL2 and EL3. The "+" and "−" signs indicate level difference of impurity concentration.

The electrode material of the electrodes EL1 to EL3 may be Pt, Au, Ag, TiAlN, SrRuO, Ru, RuN, Ir, Co, Ti, TiN, TaN, LaNiO, Al, PtIrOx, PtRhOx, Rh/TaAlN, W, etc. A metal film that provides uniform orientation may be inserted. A buffer layer, a barrier metal layer, an adhesive layer, etc. may also be inserted separately.

[Modified Example of Memory Cell Array]

Figure 4:
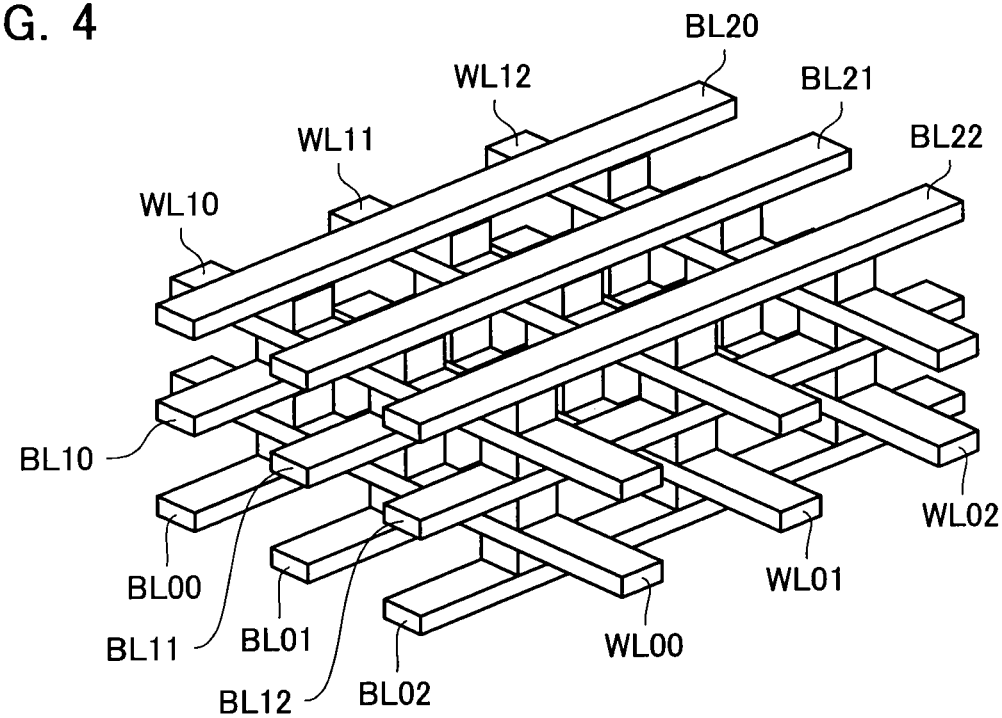
FIG. 4 shows another example of the configuration of the memory cell array 1.
Figure 5:
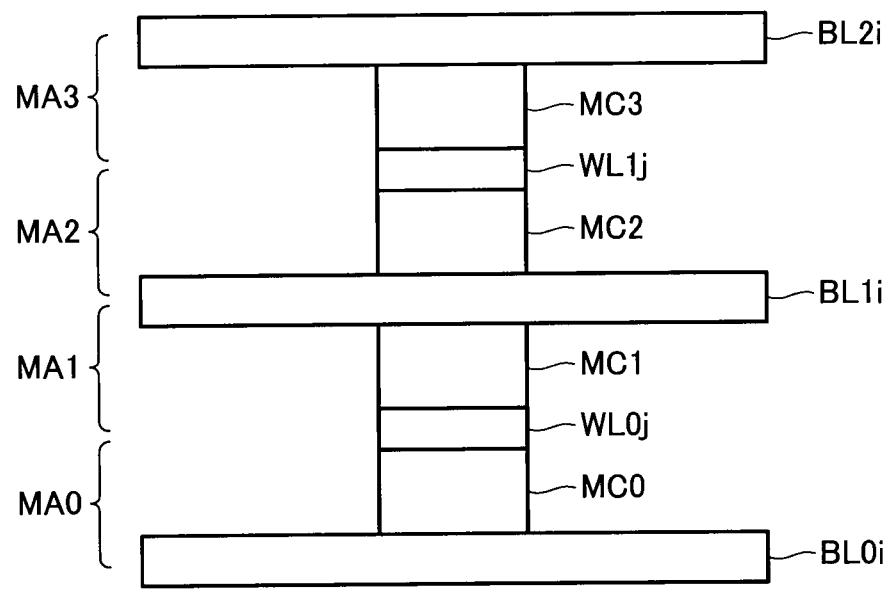
FIG. 5 shows another example of the configuration of the memory cell array 1.

As shown in FIG. 4, a three-dimensional configuration including plural layers of the memory configuration described above is also available. FIG. 5 is a cross-sectional diagram of FIG. 4 taken along a line II-II'. The shown example is a four-layered memory cell array configured by cell array layers MA0 to MA3. A word line WL0j is shared by memory cells MC0 and MC1 above and below the word line WL0j. A bit line BL1i is shared by memory cells MC1 and MC2 above and below the bit line BL1i. A word line WL1j is shared by memory cells MC2 and MC3 above and below the word line WL1j.

The layered configuration needs not be a repetition of line/cell/line/cell described above, but may be a repetition of line/cell/line/interlayer insulating film/line/cell/line with an interlayer insulating film provided between the cell array layers. The memory cell array 1 may also be divided into some memory cell groups MAT. The column control circuit 2 and the row control circuit 3 described above may be provided per MAT, per sector, or per cell array layer MA, or may be shared by them. Alternatively, these circuits may be shared by a plurality of bit lines BL for the purpose of area reduction.

Figure 6:
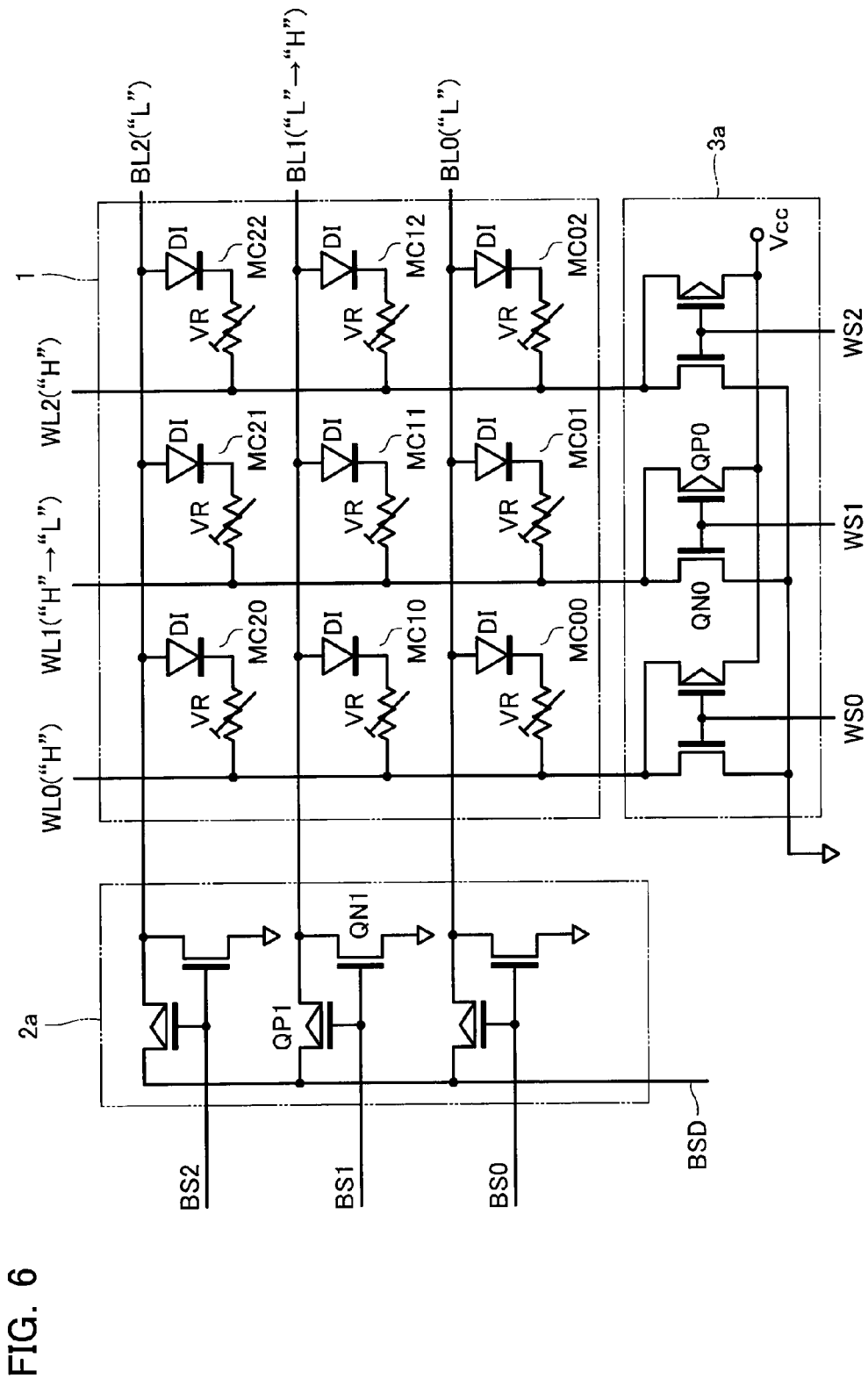
FIG. 6 is a circuit diagram of the memory cell array 1 and its peripheral circuits.

FIG. 6 is a circuit diagram of the memory cell array 1 and its peripheral circuits. In order to simplify the explanation, the following description assumes that the memory cell array 1 is a single-layered configuration. In FIG. 6, the diode D1 configuring a memory cell MC has its anode connected to a bit line BL and its cathode connected to a word line WL via the variable resistor VR. One end of each bit line BL is connected to a selecting circuit 2a configuring a part of the column control circuit 2. One end of each word line WL is connected to a selecting circuit 3a configuring a part of the row control circuit 3. As will be described later, the memory cell array 1 according to the present embodiment is configured such that n number of memory cells MC provided along one word line WL are treated as one unit, and the n number of memory cells MC configuring the one unit retain n! patterns of data as a whole. In the following example, the explanation assumes that n=3. However, it will become apparent from the following explanation that the present invention is not limited to the case of n=3. Further, needless to say, two units or more of memory cells may be provided along one word line WL.

The selecting circuit 2a includes a selecting PMOS transistor QP1 and a selecting NMOS transistor QN1 provided for a bit line BL. The selecting PMOS transistor QP1 and selecting NMOS transistor have their gates and drains connected commonly. The sources of the selecting PMOS transistors QP1 are connected commonly to a drain-side drive line BSD. The sources of the selecting NMOS transistors QN1 are connected to grounding terminals.

The transistor QP1 and the transistor QN1 have their drains connected to a bit line BL, and their gates supplied with a bit line selecting signal BSi for selecting each bit line BL.

The selecting circuit 3a includes a selecting PMOS transistor QP0 and a selecting NMOS transistor QN0 provided for a word line WL. The selecting PMOS transistor QP0 and selecting NMOS transistor QN0 have their gates and drains connected commonly. The sources of the selecting PMOS transistors QP0 are connected to a word line-side drive line BSE for applying a writing pulse and flowing a current to be detected in a data reading operation. The sources of the selecting NMOS transistors QN0 are connected to grounding terminals (a grounding voltage Vss). The transistors QP0 and QN0 have their common drain connected to a word line WL and their common gate supplied with a word line selecting signal WSi for selecting each word line WL.

In the memory cell array 1, the polarity of the diode D1 may be reversed from the polarity in the circuit of FIG. 6 (i.e., the diode D1 may be connected to have a forward direction from a word line WL to a bit line BL), such that a current may flow from a word line WL side to a bit line BL side.

Figure 7:
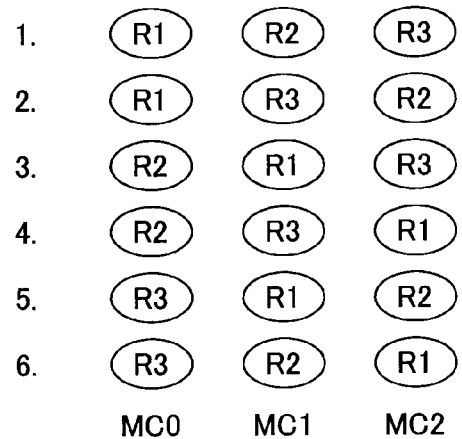
FIG. 7 is a conceptual diagram showing an operation principle of the nonvolatile semiconductor memory according to the embodiment.

Next, a data writing scheme and a data reading scheme according to the present embodiment will be explained with reference to FIG. 7. In the present embodiment, n number of memory cells MC are treated as one unit, and writing is executed such that the n number of memory cells MC in one unit may have different resistance values R1, R2, ..., and Rn respectively. The resistance values R1, R2, ..., and Rn need not be specific values or in a specific range, but need only to be different from one another. A writing operation is executed in the n number of memory cells MC in one unit such that they all have different resistance values. For example, when one of the n number of memory cells MC has a resistance value R1, none of the other (n−1) number of memory cells has the resistance value R1, but they have any of the other (n−1) number of resistance values. The same applies to the other resistance values. That is, there is only one memory cell among the n number of memory cells MC that has a resistance value Ri (i=1 to n). Therefore, the n number of memory cells MC configuring one unit can retain n! patterns of data as a whole. FIG. 7 shows a case of n=3, where each of three memory cells MC0 to MC2 has any of resistance values R1, R2, and R3, and all the memory cells MC0 to MC2 have different resistance values. In this case, the three memory cells MC (MC0 to MC2) configuring one unit can retain 3!=6 patterns of data as a whole.

Such a data retaining scheme can store a smaller amount of data than when n number of memory cells MC each retain data independently from the other memory cells. However, such a data storing scheme enables to determine data retained by n number of memory cells MC configuring one data by comparing the levels of the resistance values of the n number of memory cells MC. Determining data by comparing the resistance values of the memory cells MC with one another can greatly reduce the possibility of erroneous reading as compared with the conventional scheme that requires a reference current.

The merit of the data retaining scheme and data reading scheme according to the present embodiment will be explained in further detail. According to the conventional reading scheme based on comparison with a reference current, particularly when executing the comparison with the reference current while reading simultaneously from a plurality of bit lines, the voltage of the word line might float from a set value (e.g., a ground voltage Vss) depending on the state of the cells (the number of memory cells in a low-resistance state, etc.), making it impossible for a desired voltage to be applied to the memory cells MC. In this case, the cell currents become lower than assumed and might become lower than the reference current in spite of the memory cells being in the low-resistance state, leading to erroneous determination.

Also in the present embodiment, floating of the potential of the word line WL might occur and lower the cell currents. However, because the cell currents of two memory cells compared with each other become lower in equal measure, erroneous determination will not occur.

When a memory cell includes a diode, a reverse current of the diode might fluctuate the voltage of the bit line BL. The fluctuation of the bit line BL might become the cause of erroneous reading in the conventional scheme of comparing with the reference current. However, according to the scheme of the present embodiment, even if such a fluctuation of a bit line BL occurs, a determination result will not be greatly influenced for the same reason as described above.

The diode in the memory cell has temperature dependency and hence the cell current greatly fluctuates depending on the temperature. Therefore, unless the reference current is adjusted appropriately based on the temperature, the possibility of erroneous reading occurs. According to the scheme of the present invention which executes determination by comparing the cell currents of two memory cells, such a fluctuation is offset and the determination result will not be influenced.

As is clear, according to the present embodiment, it is possible to execute correct data reading without causing erroneous reading regardless of various fluctuation factors.

Figure 8:
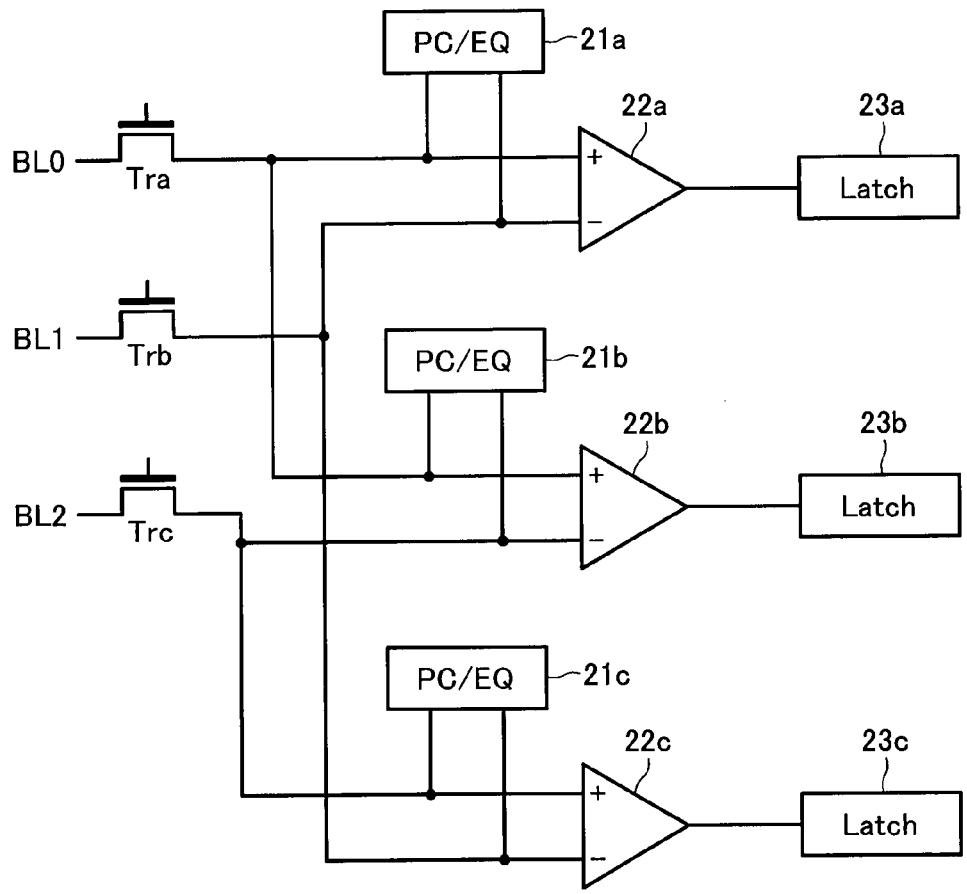
FIG. 8 is a circuit diagram showing an example of the configuration of a sense amplifier circuit 2b included in a column control circuit 2.

To be explained below with reference to FIG. 8 is an example of the configuration of the sense amplifier circuit 2b suitable for reading data from the memory cell array 1 written with data according to the scheme shown in FIG. 7. In this example, like the case described above, three memory cells MC0 to MC2 configure one unit, and 3!=6 patterns of data are read out from these memory cells MC0 to MC2 configuring one unit through bit lines BL0 to BL2.

The sense amplifier circuit 2b includes clamp transistors Tra to Trc, pre-charging and equalizing circuits 21a to 21c, differential amplifier circuits 22a to 22c, and latch circuits 23a to 23c. In FIG. 8, three differential amplifiers are provided to determine the level relationship of the resistance values of the memory cells MC0 to MC2 configuring one unit. When the number of memory cells configuring one unit is n, (n(n−1)/2) number of differential amplifiers may be provided such that each differential amplifier may determine the level relationship of the resistance values of two memory cells.

The clamp transistors Tra to Trc are transistors configured to clamp the bit line BL at a certain voltage in a reading operation. The pre-charging and equalizing circuits 21a to 21c are circuits each configured to pre-charge any two of the three bit lines BL0 to BL2 up to a voltage VSEL before a reading operation. The differential amplifier circuits 22a to 22c are circuits each configured to determine which is the higher or the lower of the cell currents flowing through any two of the three bit lines BL0 to BL2. The latch circuits 23a to 23c are configured to latch data according to differential amplification signals output by the differential amplifier circuits 22a to 22c.

Such a sense amplifier circuit 2b shown in FIG. 8 can determine the level relationship of the resistance values of the memory cells MC0 to MC2 configuring one unit based on the signals retained by the latch circuits 23a to 23c.

Next, a data writing operation according to the present embodiment will be explained with reference to the timing chart of FIG. 9. The present embodiment shows a case of writing resistance values R0, R1, and R2 (R0>R1>R2) in the memory cells MC0 to MC2 configuring one unit.

Figure 9:
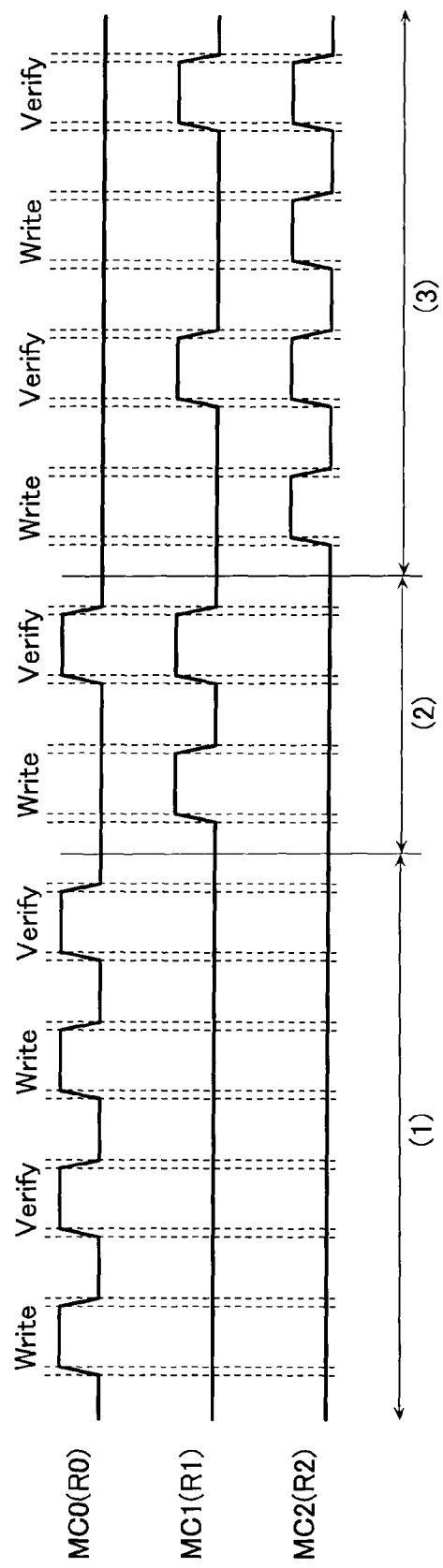
FIG. 9 is a timing chart showing a writing operation of the nonvolatile semiconductor memory device according to the embodiment.

First, a writing operation in the memory cell MC0 to be supplied with the highest resistance value R0 is executed during the period (1) of FIG. 9.

Then, a writing operation in the memory cell MC1 to be supplied with the resistance value R1 is executed during the period (2). At this time, the sense amplifier circuit 2b determines the level relationship of the resistance values of the memory cells MC0 and MC1 in a read verify operation, and when it is verified that the memory cell MC1 has been written up to the level of the resistance value R1, shifts to the next period (3).

During the period (3), a writing operation in the memory cell MC2 to be supplied with the resistance value R2 is executed. At this time, the sense amplifier circuit 2b determines the level relationship of the resistance values of the memory cells MC1 and MC2 in a read verify operation to verify whether the memory cell MC2 has been written up to the resistance value R2. When this is verified, the writing operation in the memory cells MC0 to MC2 configuring one unit is completed.

When the number of memory cells configuring one unit is n, the same writing procedure can also be employed. That is, after a given resistance value Ri is supplied to the i-th memory cell (i=1 to n−1) included in the n number of memory cells from the column control circuit 2 and the row control circuit 3, a resistance value Ri+1 lower than the resistance value Ri can be supplied to the (i+1)-th memory cell. At this time, after the writing operation in the (i+1)-th memory cell, the sense amplifier circuit 2b can determine whether the (i+1)-th memory cell has the resistance value Ri+1 or not.

[Others]

An embodiment of the present invention has thus been described. However, the present invention is not limited to this embodiment, but various modifications, additions, substitutions, deletions, diversions, etc. can be made thereonto within the scope of the spirit of the invention. For example, the data writing operation, which is executed in FIG. 8 in a manner to set the memory cells to be written to higher resistance states first, may instead be executed in a manner to set the memory cells to be written to lower resistance states first. Alternatively, a random setting procedure may be employed. In short, any procedure by which all of the n number of memory cells configuring one unit are written to different resistance values is included in the scope of the present invention.

Furthermore, it is also possible to enable an arbitrary storage scheme to be employed by appropriately switching between the scheme of retaining n! patterns of data in n number of memory cells and the conventional scheme of retaining data independently in n number of memory cells.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
a memory cell array including a plurality of memory cells arranged therein, each of the memory cells including a variable resistor and provided between a first line and a second line;
a control circuit configured to apply to the memory cell through the first and second lines a writing voltage for writing data or a reading voltage for reading data; and
a sense amplifier circuit configured to sense data retained in the memory cell based on a current flowing through the first line,
in a data writing operation, the control circuit being configured to apply the writing voltage to each of n number of memory cells configuring one unit, wherein n≥3, such that the n number of memory cells may be supplied with different resistance values from one another, a number of combinations of the different resistance values that are given to the n number of memory cells configuring the one unit representing n! patterns of data, where n! denotes factorial of the n number, and
in a data reading operation, the sense amplifier circuit being configured to compare a relationship of the resistance values of the n number of memory cells configuring the one unit, and read out n! patterns of data from the one unit,
wherein in the data reading operation, the sense amplifier circuit compares a relationship of the resistance values of a every combination of groups of two of the n number of memory cells configuring the one unit, and reads out the n! patterns of data retained in the one unit in accordance with a data combination obtained as a result of comparison.

2. The nonvolatile semiconductor memory device according to claim 1,
wherein the sense amplifier circuit includes (n(n−1)/2) number of differential amplifier circuits corresponding to n number of first lines connected to the n number of memory cells configuring the one unit respectively, and each of the (n(n−1)/2) number of differential amplifier circuits compares level relationship of currents flowing through any two of the n number of first lines.

3. The nonvolatile semiconductor memory device according to claim 2,
wherein in the data writing operation, the control circuit is configured to supply a first resistance value to an i-th memory cell (i=1 to n−1) included in the n number of memory cells configuring the one unit, and after this, supply a second resistance value lower than the first resistance value to an (i+1)-th memory cell.

4. The nonvolatile semiconductor memory device according to claim 3,
wherein the sense amplifier circuit is configured to determine, after the data writing operation in the (i+1)-th memory cell, whether the (i+1)-th memory cell has the second resistance value or not.

5. The nonvolatile semiconductor memory device according to claim 2,
wherein in the data writing operation, the control circuit is configured to execute writing in an i-th memory cell (i=1 to n−1) included in the n number of memory cells configuring the one unit, and after this, execute writing in an (i+1)-th memory cell while determining level relationship of a resistance value of the i-th memory cell and a resistance value of the (i+1)-th memory cell.

6. The nonvolatile semiconductor memory device according to claim 1,
wherein in the data writing operation, the control circuit is configured to supply a first resistance value to an i-th memory cell (i=1 to n−1) included in the n number of memory cells configuring the one unit, and after this supply a second resistance value lower than the first resistance value to an (i+1)-th memory cell.

7. The nonvolatile semiconductor memory device according to claim 6,
wherein the sense amplifier circuit is configured to determine, after the data writing operation in the (i+1)-th memory cell, whether the (i+1)-th memory cell has the second resistance value or not.

8. The nonvolatile semiconductor memory device according to claim 1,
wherein the sense amplifier circuit includes (n(n−1)/2) number of differential amplifier circuits corresponding to n number of first lines connected to the n number of memory cells configuring the one unit respectively, and
each of the (n(n−1)/2) number of differential amplifier circuits determines a relationship of currents flowing through any two of the n number of first lines.

9. The nonvolatile semiconductor memory device according to claim 8,
wherein in the data writing operation, the control circuit is configured to supply a first resistance value to an i-th memory cell (i=1 to n−1) included in the n number of memory cells configuring the one unit, and after this, supply a second resistance value lower than the first resistance value to an (i+1)-th memory cell.

10. The nonvolatile semiconductor memory device according to claim 9,
wherein the sense amplifier circuit is configured to determine, after the data writing operation in the (i+1)-th memory cell, whether the (i+1)-th memory cell has the second resistance value or not.

11. The nonvolatile semiconductor memory device according to claim 1,
wherein in the data writing operation, the control circuit is configured to execute writing in an i-th memory cell (i=1 to n−1) included in the n number of memory cells configuring the one unit, and after this, execute writing in an (i+1)-th memory cell while determining level relationship of a resistance value of the i-th memory cell and a resistance value of the (i+1)-th memory cell.

12. A nonvolatile semiconductor memory device, comprising:
a memory cell array configured by a plurality of memory cells each including a variable resistor and each provided between a first line and a second line;
a control circuit configured to apply to the memory cell through the first and second lines a writing voltage for writing data or a reading voltage for reading data; and
a sense amplifier circuit configured to sense data retained in the memory cell based on a current flowing through the first line,
n number of memory cells being configured as one unit, where n≥3, the n number of memory cells configuring the one unit being configured to be supplied with different resistance values, thereby the n number of memory cells being capable of retaining n! patterns of data by being given the n! number of combinations of the different resistance values, where n! denotes factorial of the number n, and
in a data reading operation, the sense amplifier circuit being configured to compare a relationship of the resistance values of every combination of groups of two of the n number of memory cells configuring the one unit and read out one of n! patterns of data from the one unit in accordance with a data combination obtained as a result of comparison.

13. The nonvolatile semiconductor memory device according to claim 12,
wherein in the data reading operation, the sense amplifier circuit compares a relationship of the resistance values of two memory cells of the n number of memory cells configuring the one unit and reads out the n! patterns of data retained in the one unit in accordance with a data combination obtained as a result of comparison.

14. The nonvolatile semiconductor memory device according to claim 13,
wherein the sense amplifier circuit includes (n(n−1)/2) number of differential amplifier circuits corresponding to n number of first lines connected to the n number of memory cells configuring the one unit respectively, and
each of the (n(n−1)/2) number of differential amplifier circuits determines a relationship of currents flowing through any two of the n number of first lines.

15. The nonvolatile semiconductor memory device according to claim 1,
wherein the control circuit is configured to be capable of appropriately selecting a scheme of making n number of memory cells configuring one unit retain n! patterns of data as a whole and a scheme of making n number of memory cells retain data independently.

* * * * *